(12) United States Patent
Quick et al.

(10) Patent No.: US 6,394,520 B1
(45) Date of Patent: May 28, 2002

(54) APPARATUS AND METHOD FOR HANDLING AN INTEGRATED CIRCUIT

(75) Inventors: Keith W Quick, Loveland; Stephen J Duey, Thornton, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/000,614

(22) Filed: Oct. 30, 2001

Related U.S. Application Data

(62) Division of application No. 09/428,152, filed on Oct. 27, 1999.

(51) Int. Cl.[7] .............................. B25J 15/06; B25J 19/02
(52) U.S. Cl. ..................... 294/64.1; 294/907; 29/743; 414/737; 901/40; 901/47
(58) Field of Search ............................ 294/64.1, 64.3, 294/907; 414/737, 752.1; 29/740, 743; 901/40, 35, 47

(56) References Cited

U.S. PATENT DOCUMENTS

| 3,830,592 A | 8/1974 | Kato et al. ................... 355/73 |
| 4,451,197 A | 5/1984 | Lange ......................... 901/40 |
| 4,516,254 A | 5/1985 | Komeyama et al. ........... 378/34 |
| 4,529,353 A | 7/1985 | Dean et al. .................. 414/786 |
| 4,530,635 A | 7/1985 | Engelbrecht et al. ...... 294/64.1 |
| 4,557,514 A | 12/1985 | Cushman et al. ............. 901/40 |
| 4,600,228 A | 7/1986 | Tarbuck .................... 294/64.1 |
| 4,603,867 A | 8/1986 | Babb et al. .................... 279/3 |
| 4,614,431 A | 9/1986 | Komeyama .................. 356/400 |
| 4,651,396 A | 3/1987 | Kerlidon .................... 294/64.1 |
| 4,752,668 A | 6/1988 | Rosenfield et al. ......... 219/121 |
| 4,763,941 A | 8/1988 | Sniderman ................. 294/64.1 |
| 4,825,453 A | 4/1989 | Kembo et al. ................ 378/34 |
| 5,018,936 A | 5/1991 | Izumi et al. .................. 901/40 |
| 5,033,783 A | 7/1991 | Izumi et al. .................. 901/40 |
| 5,106,139 A | 4/1992 | Palmer et al. ............. 294/64.1 |
| 5,251,266 A | 10/1993 | Spigarelli et al. ............. 901/47 |
| 5,629,657 A | 5/1997 | Bayorgeon et al. .......... 333/254 |
| 5,666,095 A | 9/1997 | Namkung et al. ........... 333/259 |
| 5,681,215 A | 10/1997 | Sheerwood et al. ......... 451/388 |
| 5,708,222 A | 1/1998 | Yonezawa et al. .......... 414/941 |
| 6,000,122 A | 12/1999 | Uchida et al. ................ 29/743 |
| 6,007,675 A | 12/1999 | Toshima .................... 414/217 |
| 6,045,433 A | 4/2000 | Dvir et al. ...................... 451/6 |
| 6,203,082 B1 | 3/2001 | Bendat et al. ............. 294/64.1 |

FOREIGN PATENT DOCUMENTS

| DE | 3637567 | 5/1988 | ................... 901/40 |
| DE | 3730396 | 3/1989 | ................... 901/47 |
| DE | 3815971 | 11/1989 | ................... 901/47 |

Primary Examiner—Eileen D. Lillis
Assistant Examiner—Paul T. Chin

(57) ABSTRACT

An apparatus and method are provided for picking up an integrated circuit and for facilitating the optical testing thereof. The apparatus comprises a pick-up mechanism that includes a vacuum chamber. The vacuum chamber is defined by an upper portion, an expandable member, and a lower portion. The lower portion defines a suction orifice that is moveable with a movement of the expandable member. An optical pathway is defined by the vacuum chamber, the optical pathway passing through the suction orifice and onto an integrated circuit that is held against the suction orifice via a vacuum pressure applied to the vacuum chamber.

12 Claims, 2 Drawing Sheets

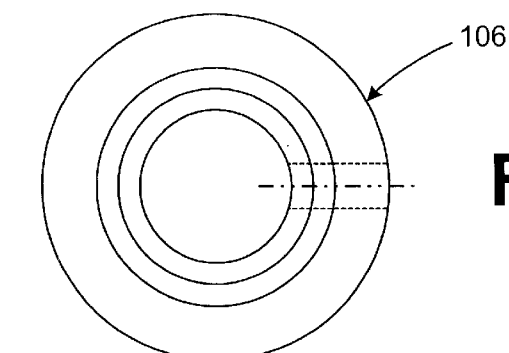
FIG. 3A
FIG. 3B
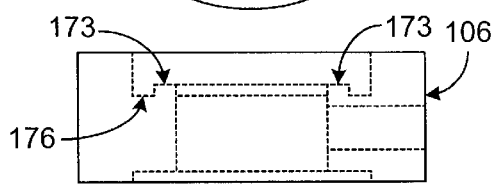
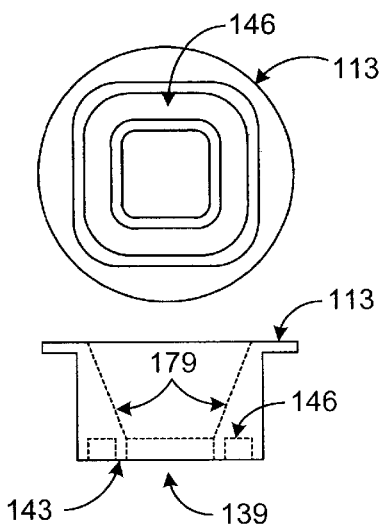
FIG. 4A
FIG. 4B
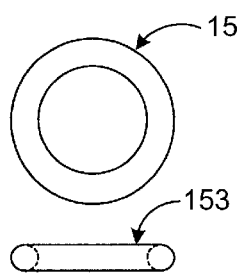
FIG. 5A
FIG. 5A

APPARATUS AND METHOD FOR HANDLING AN INTEGRATED CIRCUIT

CROSS-REFERENCE TO RELATED APPLICATION

This is a divisional of copending application Ser. No. 09/428,152 filed on Oct. 27, 1999.

TECHNICAL FIELD

The present invention is generally related to the field of integrated circuit fabrication and, more particularly, is related to an apparatus and method for the automated handling and testing of optical integrated circuits.

BACKGROUND OF THE INVENTION

The electronics industry currently produces thousands of integrated circuits each day. These circuits have come down in cost significantly in more recent years due to the use of effective mass production techniques that facilitate the current high output. The machinery employed in these mass production techniques is quite complex and often performs repetitive tasks. Such machinery is typically engineered for maximum reliability over a large number of operation cycles, whatever the specific operation may entail.

In addition to the use of automated machines to produce various integrated circuits, industry also employs automated machines to test the integrated circuits to ensure maximum reliability and quality of the end product. Due to the high volumes created, such testing equipment is designed with the goal in mind to operate with maximum efficiency over numerous cycles without failure. However, some testing systems fall short of this goal.

For example, in testing one particular type of integrated circuit, namely, an active pixel sensor, machines are employed to pick up the sensor and place it on a test circuit such that the leads of the sensor come into contact with electrical pads through which the sensor may be tested. Such sensors require that light be applied to their light sensitive surface to determine whether the response of the sensor is within acceptable parameters.

However, typical pick-up devices employed to handle such sensors do not provide an ability to both hold the sensor and apply light to the light sensitive surface. In particular, suction cups that are typically used in such handling equipment generally cover the light sensitive surfaces and a proper test may not be performed when such handlers place the sensor against the appropriate test pads.

To solve this problem, some have attempted to use suction devices that allow light to illuminate the light sensitive surfaces. However, such machinery has proven unreliable. In particular, such pick-up machines cannot effectively create a reliable vacuum seal with the integrated circuit that allows light to be applied to the light sensitive surfaces over an acceptable number of testing cycles.

SUMMARY OF THE INVENTION

In light of the foregoing, the present invention provides an apparatus and method for picking up an integrated circuit that facilitates optical testing thereof. Briefly described, the apparatus comprises a pick-up mechanism that includes a vacuum chamber. The vacuum chamber is defined by an upper portion, an expandable member, and a lower portion. The lower portion defines a suction orifice that is moveable with a movement of the expandable member. An optical pathway is defined by the vacuum chamber, the optical pathway passing through the suction orifice and onto an integrated circuit that is held against the suction orifice via a vacuum pressure applied to the vacuum chamber.

During operation, the suction orifice is applied to a surface of the integrated circuit and the vacuum is applied to the vacuum chamber, thereby applying a suction hold to the integrated circuit. The expandable member contracts, thereby moving the suction orifice in an axial direction until the integrated circuit comes into contact with a number of contact edges that stop the movement. The expandable member may be, for example, a bellows or other similar device as an integral portion of the vacuum chamber.

The present invention can also be viewed as providing a method for picking up and testing an integrated circuit. In this regard, the method can be broadly summarized by the following steps: providing a vacuum chamber having an upper portion, an expandable member, and a lower portion, the lower portion defining a suction orifice, the suction orifice being moveable with a movement of the expandable member; applying the suction orifice to a smooth face of an integrated circuit; evacuating the vacuum chamber to pick up the integrated circuit; and illuminating the smooth face of the integrated circuit with a light that propagates along an optical pathway that passes through the suction orifice.

The present invention has numerous advantages, including the movement of the suction orifice that accommodates the use of a more rigid O-ring that provides greater durability and reliability in operation. The movement of the suction orifice also allows the pick-up mechanism to be employed with integrated circuits of varying height with the less durable O-ring. In addition, due to the flexibility of the O-ring and the fact that it is frictionally mounted into the O-ring groove, it is easily replaced by hand when worn, etc. Also, the frictional mounting of the O-ring keeps it in place in the O-ring groove and it does not move into the optical pathway in any way. In addition, the pick-up mechanism allows the automated testing of active pixel sensors, for example, by applying light to the sensor while it is held by the pick-up mechanism which places the sensor over test pads for testing. Also, the over all design of the pick-up mechanism is simple, user friendly, robust and reliable in operation, efficient in operation, and easily implemented for mass commercial production.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 3A is a top view of a upper portion employed in the pick-up mechanism of FIG. 1;

FIG. 3B is a side view of the upper portion of FIG. 3A;

FIG. 4A is a bottom view of a lower portion employed in the pick-up mechanism of FIG. 1;

FIG. 4B is a side view of the lower portion of FIG. 4A;

FIG. 5A is a top view of an O-ring employed in the pick-up mechanism of FIG. 1; and FIG. 5B is a side view of the O-ring of FIG. 5A.

DETAILED DESCRIPTION OF THE INVENTION

Figure 1:
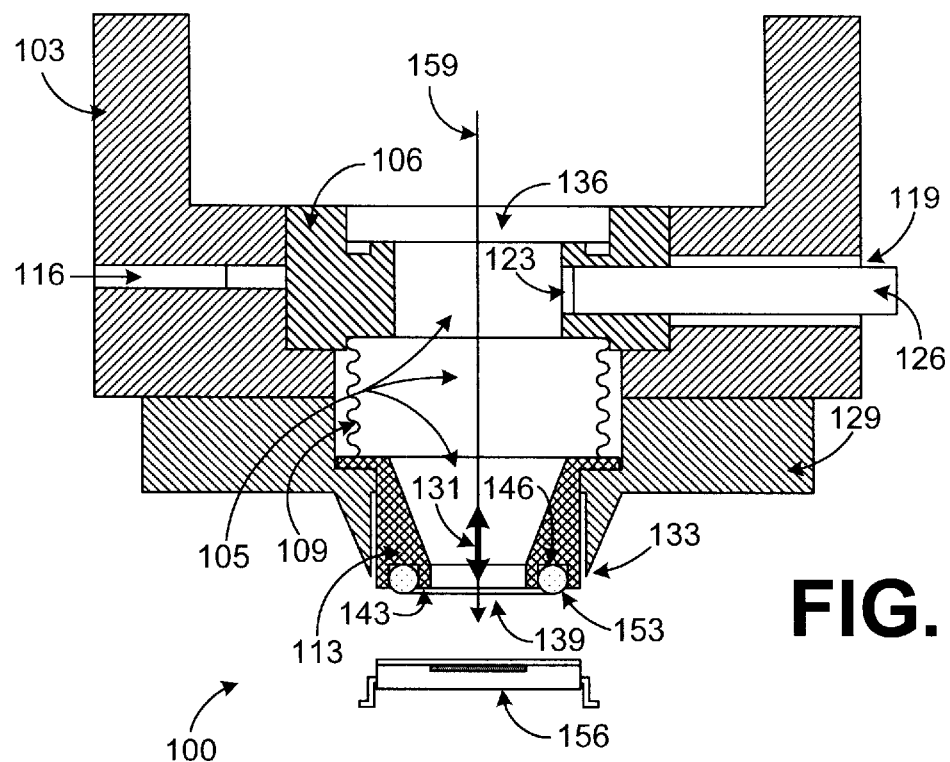
FIG. 1 is a section view of a pick-up mechanism according to an embodiment of the present invention.

With reference to FIG. 1, shown is a pick-up mechanism 100 according to an embodiment of the present invention. The pick-up mechanism 100 includes a support bracket 103 that provides a support structure for the major components of the pick-up mechanism 100. The pick-up mechanism 100 also includes a vacuum chamber 105 that is defined by an upper portion 106 top, an expandable member 109, and a lower portion 113. The upper portion 106 may comprise, for example, a top flange or other suitable structural member. The expandable portion 109 may comprise, for example, a bellows or other suitable member that expands and contracts accordingly. Also, the lower portion 113 may comprise, for example, a pick-up flange or other suitable structural member.

The upper portion 106 is set into the support bracket 103 as shown and is held into place by set screw 116. The support bracket 103 also includes a vacuum inlet 119 that provides access to a threaded vacuum inlet 123 of the upper portion 106. An appropriate vacuum fitting 126 is threaded into the threaded vacuum inlet 123 through the vacuum inlet 119 of the support bracket 103 as shown. The expandable member 109 is adhesively attached to the bottom of the upper portion 106 and the top of the lower portion 113 as shown.

The pick-up mechanism 100 also includes a mating flange 129 that is removably attached to the bottom of the support bracket 103 via one of a number of means, for example, by bolts, etc. The mating flange 129 restricts the movement of the lower portion 113 in an axial direction 131. In particular, the lower portion 113 is movable within the mating flange 129 with the movement, i.e., the expansion and/or the contraction, of the expandable member 109. The mating flange 129 restricts the movement of the lower portion 113 in the axial direction 131. The mating flange 129 also includes a number of contact edges 133 that together define an integrated circuit stop as will be discussed.

The pick-up mechanism 100 further includes a lens/glass diffuser 136 that is seated into the upper portion 106 and adhesively mounted thereto. The expandable member 109 is adhesively mounted to the bottom of the upper portion 106. Both the lens/glass diffuser 136 and the expandable member 109 are attached to the upper portion 106 using a suitable adhesive to prevent any vacuum leakage as will be discussed.

The lower portion 113 is also adhesively attached to the expandable member 109 as shown. The bottom of the lower portion 113 defines a suction orifice 139. The suction orifice 139 is exposed at its exit face 143. The lower portion 113 also includes an O-ring groove 146 that is placed around the perimeter of the exit face 143 of the suction orifice 139. Mounted in the O-ring groove 146 is an O-ring 153. The O-ring 153 is preferably frictionally mounted into the O-ring groove 146 to provide for easy removal and replacement by hand. The O-ring 153 defines a ceiling junction with an integrated circuit 156 that may include, for example, active pixel sensor circuits.

The vacuum chamber 105 generally defines an optical pathway 159 that passes through the lens/glass diffuser 136, the upper portion 106, expandable member 109, and the lower portion 113 and exits out of the suction orifice 139. The optical pathway 159 advantageously facilitates an optical testing of the integrated circuit 156 while it is held by the pick-up mechanism 100 as will be discussed.

Figure 2:
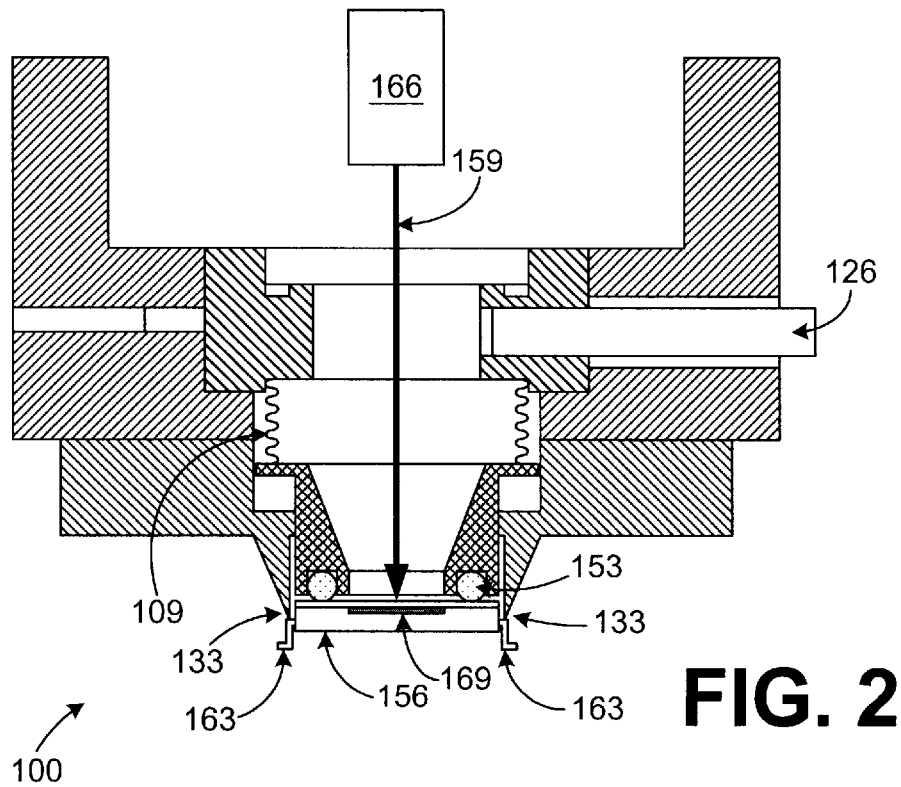
FIG. 2 is a section view of the pick-up mechanism of FIG. 1 engaging an integrated circuit.

With reference to FIG. 2, the operation of the pick-up mechanism 100 is discussed. To begin, the pick-up mechanism 100 is positioned above, for example, an optical integrated circuit 156 or other integrated circuit that is to be tested. The suction orifice 139 is then placed against the upper surface of the integrated circuit 156 such that the O-ring 153 is mated against the upper surface of the integrated circuit 156. Thereafter, a vacuum pressure is applied to the vacuum inlet 126, causing the lower portion 113 with the integrated circuit 156 to be pulled upward in an axial motion.

The axial movement occurs when the expandable member 109 contracts as shown. The O-ring 153 advantageously creates a vacuum seal with the upper surface of the integrated circuit 156 and therefore the integrated circuit is held against the lower portion 113. Together the lower portion 113 and the integrated circuit 156 will move upward until the contact edges 133 come into contact with the leads 163 of the integrated circuit 156. Although two contact edges 133 are shown, it is understood that there may be four contact edges 133 that come into contact with leads 163 that extend from the integrated circuit 156 on all four sides, etc. The integrated circuit 156 is thus seated against the contact edges 133 thereby preventing the further axial movement of the lower portion 113 and the integrated circuit 156.

Thereafter, the pick-up mechanism 100 travels to a new position to place the integrated circuit 156 on contact pads for testing as is known in the art. A light source 166 may then be employed to generate light that propagates along the optical pathway 159 and falls on the sensor 156. The light source 166 may comprise, for example, a laser, incoherent light, or other suitable light source. Light sensitive components 169 located on the surface of the integrated circuit 156 sense the light and the testing of the integrated circuit 156 is performed. The light sensitive components 169 may be covered by a layer of transparent material, such as glass, etc. Thus, the integrated circuit 156 may comprise, for example, an active pixel sensor or other similar integrated circuit. The integrated circuit 156 is released by relieving the vacuum at the vacuum inlet 126.

The pick-up mechanism 100 provides several benefits including an axial movement of the suction orifice 139 that accommodates the use of a more rigid O-ring 153. The axial movement allows the pick-up mechanism 100 to be employed with integrated circuits 156 of varying height and at the same time allows the use of the O-ring 153. In particular, the use of the expandable member 109 allows the suction orifice 139 along with the O-ring 153 to be placed over integrated circuits with greater height as the lower portion 113 will be pushed up into the mating flange 129, the expandable member 109 contracting accordingly.

In addition, due to the material makeup of the O-ring 153, it can last through thousands of pick-up cycles and is easily replaced by hand. Also, the O-ring 153 stays in place in the O-ring groove 146 and does not block the optical pathway 159 in any way. Thus, the pick-up mechanism 100 facilitates the automated testing of active pixel sensors, for example, by applying light to the sensor while it is held by the pickup mechanism 100 which places the sensor over test pads for testing.

The materials that are used to manufacture the support bracket 103, upper portion 106, and the lower portion 113 may be, for example, aluminum, steel, or other material. Aluminum or other lightweight materials are preferable as the resulting pick-up mechanism 100 requires less force and energy to manipulate during use, etc. The expandable member 109 may comprise stainless steel or other suitable material that is durable and can withstand repeated use without degradation or developing holes, etc.

With reference to FIGS. 3A AND 3B, shown are side and top views of the upper portion 106. The upper portion 106 facilitates adhesive mounting of the lens/glass diffuser 136 therein. Specifically, a silicon adhesive maybe applied to a contact surface 173 of the upper portion 106 or to the lens/glass diffuser 136. Thereafter, the lens/glass diffuser 136 is placed into position in the upper portion 106. The upper portion 106 also includes spill over grooves 176 that accommodate a run over of silicon adhesive. After placing the lens/glass diffuser 136 into the upper portion 106, it is given a quarter turn, for example, to ensure a proper vacuum seal is formed between the lens/glass diffuser 136 and the upper portion 106.

With reference to FIGS. 4A AND 4B, shown are top and side views of the lower portion 113 according to another embodiment of the present invention. The lower portion 113 includes interior angled surfaces 179. The interior angled surfaces 179 serve to prevent the light propagating along the optical pathway 159 (FIG. 2) from reflecting off of the interior angled surfaces 179 thereby adversely affecting the uniformity of the light that falls on the light sensitive components 169 (FIG. 2). Rather than fall on the light sensitive components 169, the reflected light propagates toward the opposing interior angled surfaces 179. The angle of the interior angled surfaces 179 with respect to the optical pathway 159 is, for example, 20 degrees, but other angles may be employed. Also, the interior angled surfaces 179 as well as the entire interior of the lower portion 113 are preferably colored in a non-reflective color such as, for example, flat black to reduce unwanted reflection of the light that propagates along the optical pathway 159.

The O-ring groove 146 located around the suction orifice 139 preferably accommodates the frictional mounting of the O-ring 153 therein. The O-ring groove 146 may appear in many different shapes and sizes, depending upon the particular size and shape of the integrated circuit 156 that one wishes to pick up with the pick-up mechanism 100. Due to the fact that the O-ring 153 is made of a flexible material, the O-ring can typically be fitted into the O-ring groove 146 even though the O-ring groove 146 is a different shape than the O-ring 153.

The O-ring groove 146 also includes a surface smoothness that is necessary to form a vacuum seal between the O-ring 153 and the lower portion 113. For best results, the roughness/height index value of the surface of the O-ring groove 146 is generally not greater than 16 microinches, for example, although other smoothness factors may be employed providing that a proper vacuum seal is formed. Alternatively, the O-ring may be mounted into the O-ring groove 146 using an appropriate adhesive, etc., however such a mounting may make the O-ring 153 harder to remove.

Finally, with reference to FIGS. 5A AND 5B, shown are side and top views of the O-ring 153. The O-ring 153 is comprised of a material of sufficient hardness to prevent the integrated circuit 156 (FIG. 1) from sticking to the O-ring 153 itself after the vacuum is relieved in the vacuum chamber 104 (FIG. 1). The material of the O-ring 153 is also preferably durability and capable of withstanding harsh atmospheres. For example, the O-ring 153 may be exposed to solvents such as acetone or alcohol in the typical integrated circuit manufacturing environment and should not experience any significant degradation therefrom. One suitable material that may be used for the O-ring 153, for example, is Viton, manufactured by and commercially available from Pressure Seals, Inc., of South Windsor, Conn. although other suitable materials may be employed as well keeping the above criterion in mind.

Many variations and modifications may be made to the above-described embodiment(s) of the invention without departing substantially from the spirit and principles of the invention. All such modifications and variations are intended to be included herein within the scope of the present invention.

What is claimed is:

1. A method for making a device to pick up and test an integrated circuit, comprising the steps of:

providing a vacuum chamber having an expandable member, an aperture, an optical pathway and a suction orifice, the suction orifice being moveable with an expansion and a contraction of the expandable member so that contact is made with the integrated circuit when the expandable member is expanded, and the aperture aligned with the optical pathway;

providing an aperture coverage means affixed to the vacuum chamber, the aperture coverage means configured to permit passage of light therethrough.

2. The method of claim 1, further comprising the step of sealing the aperture coverage means to the vacuum chamber with a sealing means such that a vacuum applied to the vacuum chamber is maintained when the suction orifice is in contact with a surface of the integrated circuit.

3. A method for using a device to pick up and test an integrated circuit, comprising the steps of:

expanding an expandable member of a vacuum chamber having the expandable member, an aperture, an optical pathway and a suction orifice, the suction orifice being moveable with expansion and contraction of the expandable member;

contacting a surface of the integrated circuit with the suction orifice when the expandable member is expanded;

providing a vacuum to the vacuum chamber so that the integrated circuit is firmly held in position by the suction orifice;

actuating a light source such that light propagates through an aperture coverage means affixed to the vacuum chamber, the aperture coverage means configured to permit passage of light therethrough, and such that light propagates along the optical pathway and onto the integrated circuit; and testing the integrated circuit.

4. The method of claim 3, further comprising the step of maintaining the vacuum in the vacuum chamber concurrently with the steps of actuating the light source and testing the integrated circuit.

5. The method of claim 3, further comprising the step of releasing the vacuum in the vacuum chamber before with the steps of actuating the light source and testing the integrated circuit.

6. The method of claim 3, wherein the step of actuating the light source further includes the step of generating laser light.

7. The method of claim 3, wherein the step of actuating the light source further includes the step of generating incoherent light.

8. An apparatus for picking up an integrated circuit, comprising:
- a vacuum chamber having an expandable member and a suction orifice, the suction orifice being moveable with an expansion and a contraction of the expandable member;
- an optical pathway defined by the vacuum chamber, the optical pathway passing through the suction orifice;
- a vacuum chamber cover affixed to the vacuum chamber and having an aperture aligned with the optical pathway;
- an aperture coverage means, the aperture coverage means configured to permit the passage of light therethrough; and
- a plurality of contact edges, each one of the contact edges affixed to the expandable member such that when the expandable member is expanded, each one of the contact edges contacts at least one of a plurality of pins on the integrated circuit such that the pins are inserted into an integrated circuit tester,
- whereby the integrated circuit can be lifted by engaging the suction orifice and establishing the vacuum in the vacuum chamber therewith and whereby light propagating along the optical pathway falls on the integrated circuit so that the integrated circuit may be tested.

9. An apparatus for picking up an integrated circuit, comprising:
- a vacuum chamber comprising:
    - an expandable member;
    - a suction orifice, the suction orifice being moveable with an expansion and a contraction of the expandable member, and
    - a plurality of interior angled surfaces configured such that a portion of light propagating along the optical pathway is reflected away from the integrated circuit so that light falling on the integrated circuit is uniform;
- an optical pathway defined by the vacuum chamber, the optical pathway passing through the suction orifice;
- a vacuum chamber cover affixed to the vacuum chamber and having an aperture aligned with the optical pathway; and
- an aperture cover, the aperture cover configured to permit the passage of light therethrough, whereby the integrated circuit can be lifted by engaging the suction orifice and establishing the vacuum in the vacuum chamber therewith and whereby light propagating along the optical pathway falls on the integrated circuit so that the integrated circuit is tested.

10. The apparatus of claim 9, the plurality of interior angled surfaces further comprising a non-reflective color surface such that the portion of light reflected away from the integrated circuit is minimized.

11. The apparatus of claim 10, wherein the non-reflective color surface is a flat black color.

12. The apparatus of claim 9, further comprising a sealing means, the sealing means configured to affix the aperture coverage means to the aperture in the vacuum chamber cover such that a vacuum applied to the vacuum chamber is maintained when the suction orifice is in contact with the integrated circuit.

\* \* \* \* \*